United States Patent

Choi et al.

[11] Patent Number: 6,040,596
[45] Date of Patent: *Mar. 21, 2000

[54] DYNAMIC RANDOM ACCESS MEMORY DEVICES HAVING IMPROVED PERIPHERAL CIRCUIT RESISTORS THEREIN

[75] Inventors: Chang-Shik Choi; Young-Woo Park, both of Kyunggi-do, Rep. of Korea

[73] Assignee: Samsung Electronics Co., Ltd., Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/897,365

[22] Filed: Jul. 22, 1997

[51] Int. Cl.[7] .................. H01L 27/108; H01L 29/76; H01L 29/94; H01L 29/00
[52] U.S. Cl. .................. 257/306; 257/296; 257/532; 257/533
[58] Field of Search .................. 257/296–303, 257/755, 383, 532–535; 438/396–398, 253–254

[56] References Cited

U.S. PATENT DOCUMENTS

| | | | |
|---|---|---|---|
| 4,805,147 | 2/1989 | Yamanaka et al. | 257/297 |
| 5,014,104 | 5/1991 | Ema | 257/383 |
| 5,187,122 | 2/1993 | Bonis | 257/755 |
| 5,352,623 | 10/1994 | Kamiyama | 438/396 |
| 5,418,180 | 5/1995 | Brown | 438/398 |
| 5,736,421 | 4/1998 | Shimomura et al. | 438/396 |

FOREIGN PATENT DOCUMENTS 405029563  2/1993  Japan .................. 257/296

*Primary Examiner*—Minh Loan Tran
*Assistant Examiner*—Cuong Quang Nguyen
*Attorney, Agent, or Firm*—Myers Bigel Sibley & Sajovec

[57] ABSTRACT

A semiconductor memory device has a cell array portion for storing data and a peripheral circuit portion for driving a plurality of unit cells of the cell array portion on a same semiconductor substrate. The device comprises a plate electrode formed in the cell array portion; and a resistor formed in the peripheral circuit portion, said resistor being made of the same semiconductor material that said plate electrode is made of.

9 Claims, 6 Drawing Sheets

DYNAMIC RANDOM ACCESS MEMORY DEVICES HAVING IMPROVED PERIPHERAL CIRCUIT RESISTORS THEREIN

FIELD OF THE INVENTION

The present invention relates to integrated circuits and methods of forming integrated circuits, and more particularly to semiconductor memory devices and methods of forming semiconductor memory devices.

BACKGROUND OF THE INVENTION

Semiconductor memory device is classified into a cell array portion and a peripheral circuit portion. The cell array portion has a plurality of unit cells which are arranged in the form of matrix, so as to store data in the unit cells. The peripheral circuit portion is provided to drive the unit cells and is located at the outside of the cell array portion. In general, a unit cell of DRAM device is comprised of one transistor and one capacitor, while the peripheral circuit thereof is comprised of a plurality of circuit components, for instance, various types of transistors and a large number of resistors.

When a semiconductor memory device is fabricated, the cell array and peripheral circuit portions are nearly formed at the same time. Thus, some semiconductor material used to form the cell array portion may be sometimes used to form the circuit components constituting the peripheral circuit portion.

FIG. 1A and 1B show the construction of a prior art DRAM device. FIG. 1A shows, by a cross-sectional representation, a portion of cell array portion of the prior art DRAM device, and FIG. 1B shows, by a cross-sectional representation, a portion of peripheral circuit portion thereof. In this prior art DRAM device, a resistor 29 is made of the same semiconductor material that a bit line 28 is made of. From these figures, reference numeral 10 denotes a semiconductor substrate, numeral 12 denotes a field oxide layer, numeral 14 denotes a source region, numeral 16 denotes a drain region, numeral 18 denotes a gate electrode, numeral 20 denotes an insulation layer for electrically insulating the gate electrode 18 from other conductive layers, numeral 22 denotes a first pad layer for connecting a storage electrode and the source region 14, numeral 24 denotes a second pad layer for connecting a bit line and the drain region 16, numeral 26 denotes an inter-layer insulating layer, numeral 28 denotes a bit line, and numeral 29 denotes a resistor.

The bit line 28 is, as shown in FIG. 1A, comprised of two layers, one of which is a polysilicon layer 28a and the other is a silicide layer 28b formed on the polysilicon layer 28a. Also, the resistor 29 has a polysilicon layer 29a and the other is a silicide layer 29b formed on the polysilicon layer 29a, as shown in FIG. 1B.

In an effort to enhance the integration degree and operation speed of a semiconductor memory device, a polycide structure comprised of overlapped polysilicon and silicide layers has been mostly used to form a gate electrode, as compared with a single polysilicon structure. This is because resistance of the gate electrode can be reduced owing to less sheet resistance of the silicide layer. The sheet resistance (Rs) of the polycide may be varied, depending on the thickness and specific resistance of the polycide but in general, is quite small level of about 2~20 Ω/□.

As illustrated in FIG. 1B, therefore, in order to form the resistor of the memory device using the gate electrode-forming material (i.e., polycide), the length of the resistor's should be sufficiently extended.

When polycide is intended for using it as the resistor, a larger area occupied by the resistor should be required owing to the above reason but if this is the case, such larger occupation may affect the integration degree of a semiconductor memory device and malfunction of the memory device may occur due to undesirable parasitic capacitance among various conductive layers.

FIG. 2A and FIG. 2B show, by cross-sectional representations, the construction of another prior art DRAM device. FIG. 2A shows, by a cross-sectional representation, a portion of cell array portion of another prior art DRAM device, and FIG. 2B shows, by a cross-sectional representation, a portion of peripheral circuit portion thereof. In this prior art DRAM device, In this DRAM device, a resistor 35 is made of the same semiconductor material that a storage electrode 34 is made of. From these figures, reference numeral 30 denotes an etch-stopper layer, numeral 32 denotes an insulating layer, numeral 34 denotes a storage electrode, and numeral 35 denotes the resistor. Of undescribed numerals of FIGS. 2A and 2B, the same reference numerals as those of FIGS. 1A and 1B denote the same portions, respectively.

The resistor 35 has the same structure as that of the storage electrode 34, as shown by cylindrical shapes of FIG. 2A and FIG. 2B. This is because a process of forming the storage electrode is simultaneously performed at both cell array portion and peripheral circuit portion. That is, the resistor 35 is formed during the formation of the storage electrode 34, and thus it resembles a shape of the storage electrode.

With the increase of the integration degree of semiconductor memory devices, a capacitor constituting a unit cell has been formed in a three-dimensional structure, e.g., cylindrical, pin, and crown shapes. When the resistor is formed in a three-dimensional structure, polysilicon having somewhat high sheet resistance is employed as the storage electrode-forming material. However, such material has recognized some disadvantages as follows:

a) Since there exists a big deviation in sheet resistance (Rs) due to the process steps, desired resistance value may not be easily obtained.

b) It is not easy to form a contact window for electrically connecting a metal layer and the resistor with each other.

Under such circumstances, there is a need to overcome the above mentioned problems in fabricating a semiconductor memory device with a bit line which is made of polycide.

SUMMARY OF THE INVENTION

The present invention is intended to overcome the prior art problems.

It is therefore an object of the invention to provide a semiconductor memory device which is adapted to enhancement of integration degree.

It is another object of this invention to provide a semiconductor memory device whose resistor has less deviation of sheet resistance.

It is further object of this invention to provide a method for fabricating a semiconductor memory device which is suitable to fulfill the objects.

So as to achieve the above stated objects of the present invention, according to an aspect, a semiconductor memory device has a cell array portion for storing data and a peripheral circuit portion for driving a plurality of unit cells of the cell array portion on a same semiconductor substrate. The device comprises a plate electrode formed in the cell array portion; and a resistor formed in the peripheral circuit portion, said resistor being made of the same semiconductor material that said plate electrode is made of.

Preferably, the resistor has a plane surface thereof. The plate electrode is made of polysilicon. The resistor is formed in the range of about 500~3,000 Å in thickness. The plate electrode is made of a titanium nitride layer and a polysilicon layer overlapped with each other. The resistor is made of a polysilicon layer having a thickness of about 500~3,000 Å, and said titanium nitride layer is formed in the range of 50~1,000 Å in thickness. The memory device further comprises a bit line which has a polysilicon layer and a silicide layer formed on the polysilicon layer.

According to the other aspect, a method for fabricating a semiconductor memory device having a cell array portion for storing data and a peripheral circuit portion for driving a plurality of unit cells of the cell array portion on a same semiconductor substrate, said method comprises the steps of partially forming a storage electrode layer on the cell array and peripheral circuit portions; removing the storage electrode layer formed on the peripheral circuit portion; forming a dielectric layer over the semiconductor substrate; forming a plate electrode layer on the dielectric layer; forming an etch-stopper layer on the plate electrode layer; removing the etch-stopper layer formed on areas except the cell array portion as well as an area where the resistor is formed; and etching the plate electrode layer using the remaining etch-stopper layer as a mask to simultaneously form the plate electrode of the cell array portion and a resistor layer of the peripheral circuit portion.

Preferably, the method further comprises the steps of, before forming the storage electrode layer, forming an inter-layer insulating layer on the semiconductor substrate, and sequentially forming a silicon nitride layer and an insulating layer on the inter-layer insulating layer. The dielectric layer, the insulating layer and the silicon nitride layer are simultaneously removed during etching of the plate electrode layer. The inter-layer insulating layer has a planarized surface formed by a planarization process. The dielectric layer comprises a nitride layer and an oxide layer overlapped with each other. The plate electrode layer comprises a polysilicon layer. The dielectric layer comprise $Ta_2O_5$. The plate electrode layer comprises a titanium nitride layer and a polysilicon layer overlapped with each other.

With the semiconductor memory device and the method for fabricating the same, the resistor formed in the peripheral circuit portion is made of the same semiconductor material that said plate electrode layer is made of. Thus, the present invention has several advantages as follows:

1) As compared with a resistor made of a bit line-forming material, for instance, a polycide material, it is very easy to control a sheet resistance in the device whose resistor is made of a plate electrode-forming material. The easy control of the sheet resistance in the devices leads to free design of the resistor size, thus ensuring the integration enhancement.

2) Since an upper surface of the resistor may be formed in a plane form, any instability of resistance occurring due to deviation of a large sheet resistance of the device may be settled.

3) Finally, a window for contact may be easily formed on the resistor.

BRIEF DESCRIPTION OF THE DRAWINGS

This invention may be understood and its object and advantages will become apparent to those skilled in the art by reference to the accompanying drawings as follows:

FIG. 1A and FIG. 1B are cross-sectional views showing the construction of a prior art DRAM device whose a resistor is made of a bit line-forming material, wherein FIG. 1A shows a portion of the cell array portion, and wherein FIG. 1B shows a portion of the peripheral circuit portion;

FIG. 2A and FIG. 2B are cross-sectional views showing the construction of another prior art DRAM device whose a resistor is made of a storage electrode-forming material, wherein FIG. 2A shows a portion of the cell array portion, and wherein FIG. 2B shows a portion of the peripheral circuit portion;

FIG. 3A and FIG. 3B are cross-sectional views showing the construction of a novel DRAM device whose a resistor is made of a plate electrode-forming material, wherein FIG. 3A shows a portion of the cell array portion, and wherein FIG. 3B shows a portion of the peripheral circuit portion;

DESCRIPTION OF PREFERRED EMBODIMENTS

Figure 1A:
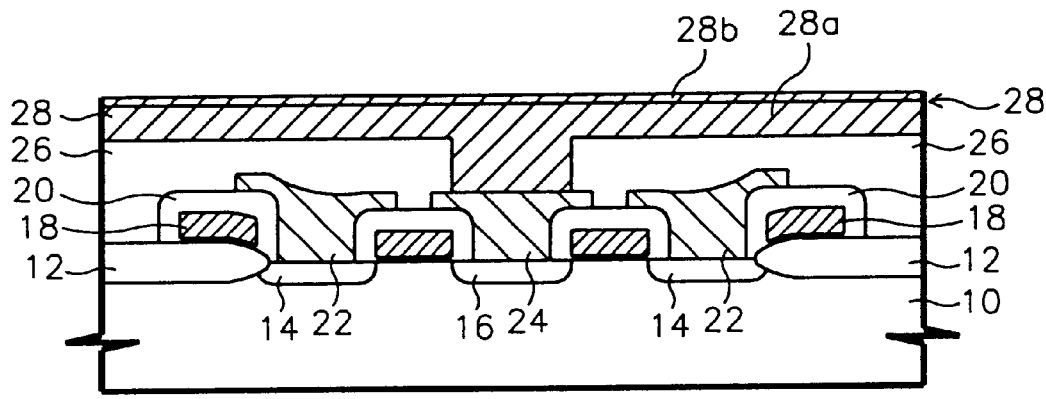
Figure 1B:
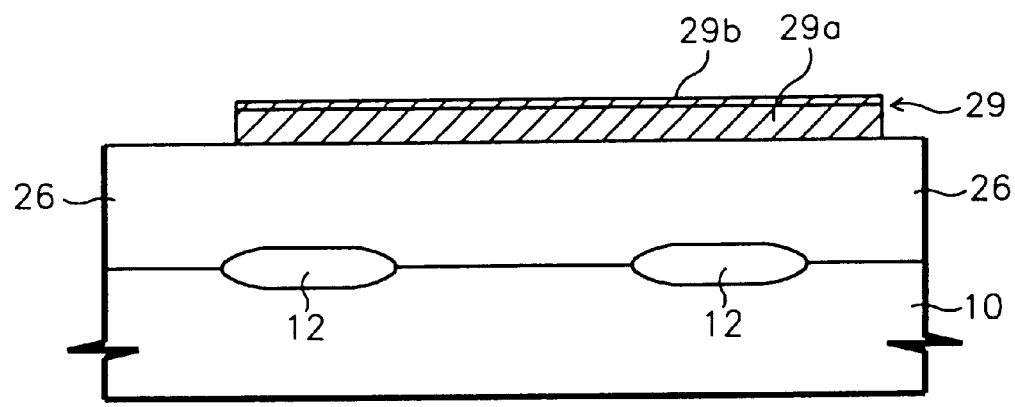

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 3A:
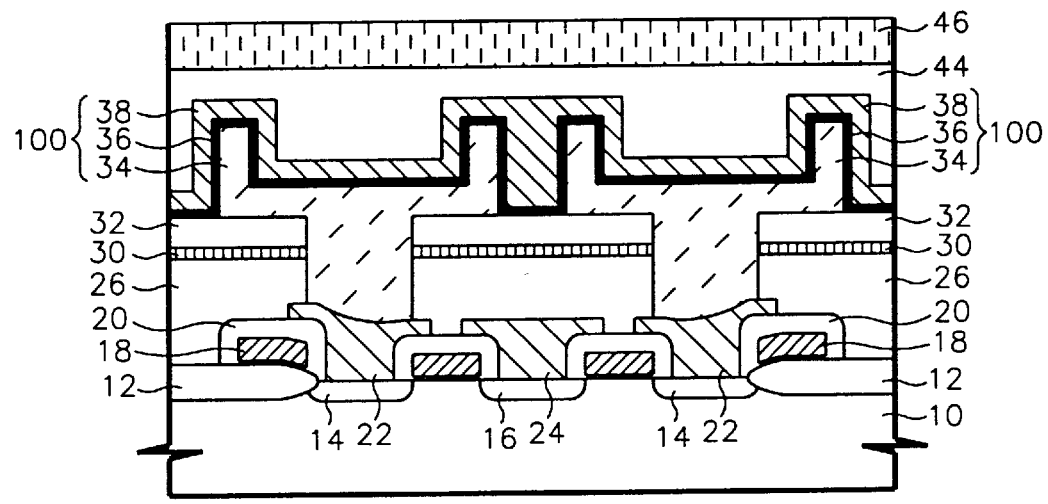
Figure 3B:
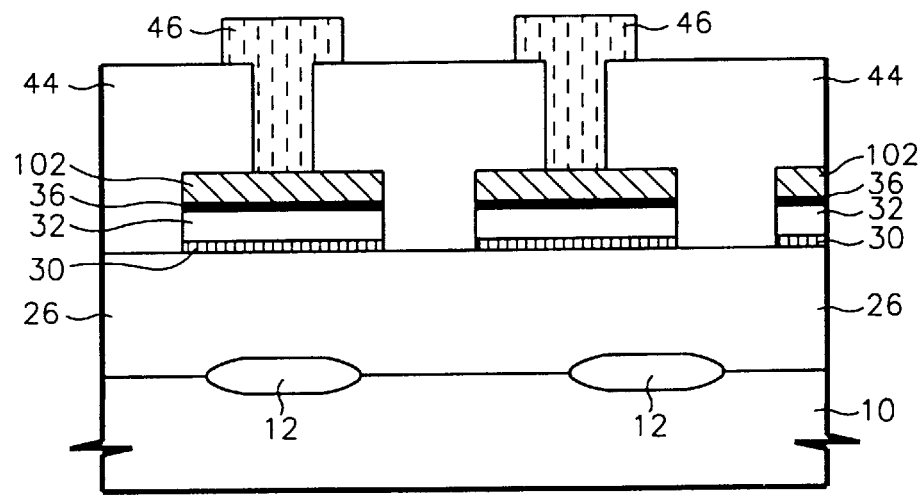

Referring to FIGS. 3A and 3B, a novel semiconductor device in accordance with an embodiment of the present invention has a cell capacitor 100 which is formed in a three-dimensional structure, and a resistor 102 which is made of a plate electrode-forming material which constitutes a plate electrode 38 of the cell capacitor 100 is made of. An upper surface of the resistor 102 is formed in a plane shape by a planarization utilizing an insulating layer 26, etc. The plate electrode 38 is formed in a cell array portion and the resistor is formed in a peripheral circuit portion. Particularly, the resistor 102 is made of the same semiconductor material that the plate electrode 38 is made of. A metal layer 46 is connected with the resistor 102 via a contact window formed on the resistor 102. A pad layer 24 is connected with a bit line (not shown in FIGS. 3A and 3B) having a typical polycide structure.

Hence, in the event that polysilicon is used as a plate electrode-forming material, the resistor 102 has a thickness of 500~3000 Å. Alternatively, the plate electrode 38 may have a stacked structure of both titanium nitride and polysilicon. In this case, the polysilicon has a thickness of about 500~3000 Å, and the titanium nitride has a thickness of about 50~1000 Å.

Hereinafter, a method for fabricating the DRAM device according to an embodiment of the present invention will be described in details with reference to FIGS. 4 through 5. FIGS. 4A to 4C illustrates the process steps for fabricating the DRAM device of FIG. 3 where a portion of the cell array portion is shown, and FIGS. 5A to 5C illustrates the process steps for fabricating the DRAM device where a portion of the peripheral region is shown.

Figure 4A:
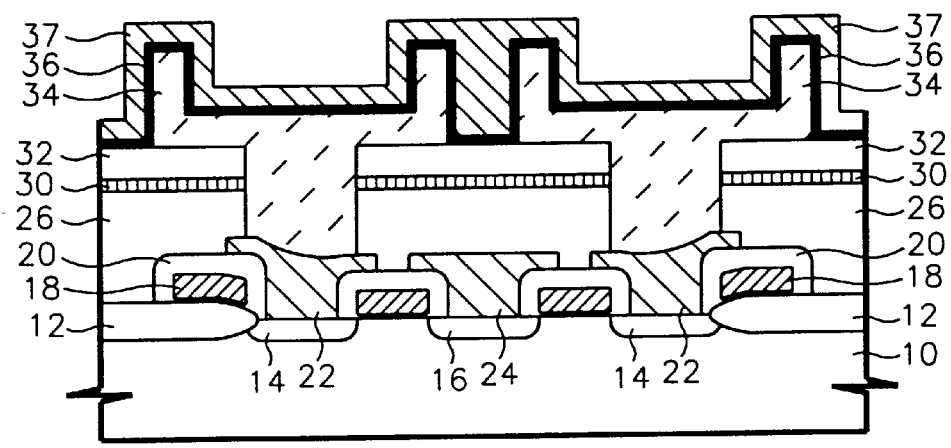
FIGS. 4A to 4C are cross-sectional views illustrating the process steps for fabricating the DRAM device of FIG. 3 where a portion of the cell array portion is shown.
Figure 5A:
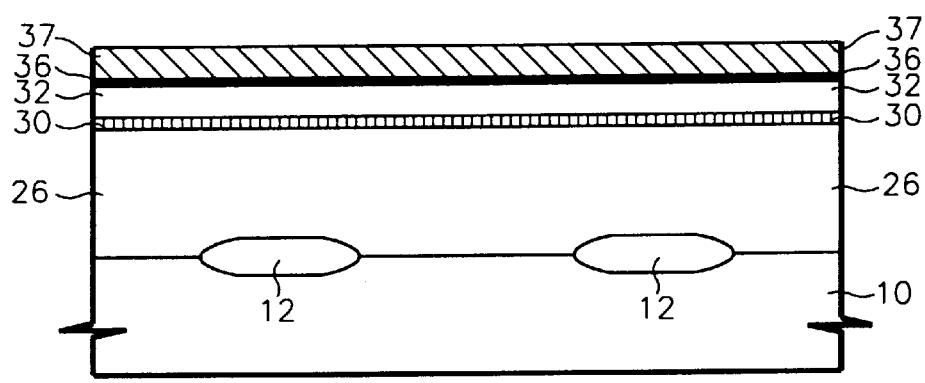
FIGS. 5A to 5C are cross-sectional views illustrating the process steps for fabricating the DRAM device where a portion of the peripheral region is shown.

Referring to FIGS. 4A and 5A, it is illustrated that, after the formation of a storage electrode 34, a dielectric layer 36 and a plate electrode-forming material layer 37 are sequentially formed over a semiconductor substrate. This resulting structure may be fabricated by following process steps.

Figure 4B:
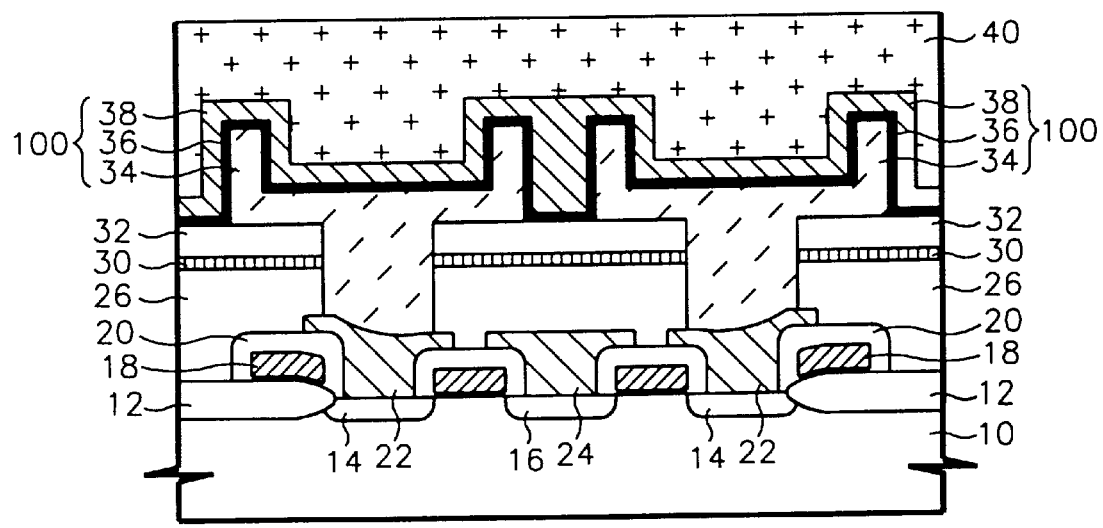

Firstly, a storage electrode layer 35 is formed on the cell array and peripheral circuit portions of the memory device, as shown in FIG. 4B. The storage electrode layer 35 (e.g., a dummy storage electrode) which is formed only on the peripheral circuit portion is selectively removed, and then a high dielectric layer is deposited over the entire surface of the substrate to form a dielectric layer 36. Next, a conductive material is deposited on the dielectric layer 36 to form a plate electrode layer 37. At this time, a bit line (not shown) is formed by depositing a silicide layer on a polysilicon layer.

In case that the dielectric layer 36 is comprised of two layers, a nitride layer and an oxide layer (i.e., NO structure) which are overlapped with each other, polysilicon is used as the conductive material. Also, in case that the dielectric layer 36 is made of $Ta_2O_6$, a stacked layer of both titanium nitride and polysilicon materials is used as the conductive material.

In the former case, it is preferred that the plate electrode-forming material layer 37 should be formed in a thickness of about 500~3,000 Å. In the latter case, it is preferred that of the materials constituting the electrode-forming material layer 37, the titanium nitride should be evaporated in a thickness of about 50~1,000 Å and the polysilicon evaporated in a thickness of about 500~3,000 Å.

From FIGS. 4B and 5B, it is illustrated that the resistor 102 is formed by the below described process steps.

Figure 5B:
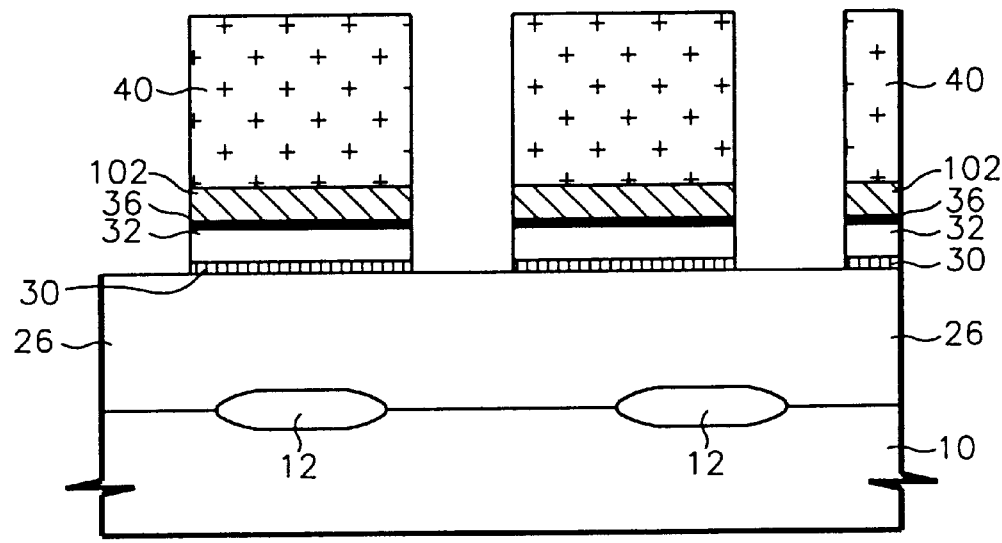

As shown in FIGS. 4B and 5B, on the resulting substrate where the plate electrode-forming material layer 37 is formed, for instance, a photoresist layer (not shown) is deposited. Next, an etching process is performed to remove the photoresist layer formed on areas except the cell array portion as well as an area where the resistor 102 is formed. As a result, a photoresist pattern 40 is formed. Using the photoresist pattern 40 as an etching mask, an etching process is performed to sequentially remove the plate electrode-forming material layer 37, the dielectric layer 36, the insulating layer 32 and the etch-stopper layer 30, so that the resistor 102 is formed.

After the formation of the resistor 102, the plate electrode-forming material layer 37 which remains at the cell array portion is used as the plate electrode 38. Thus, a cell capacitor 100 is comprised of the storage electrode 34, the dielectric layer 36 and the plate electrode 38 which are defined in the cell array portion.

Figure 4C:
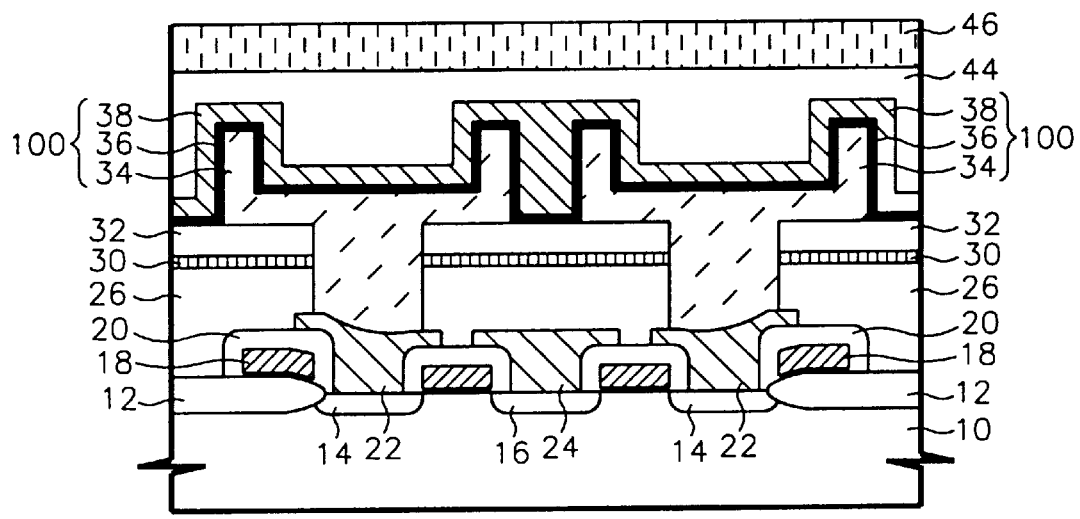
Figure 5C:
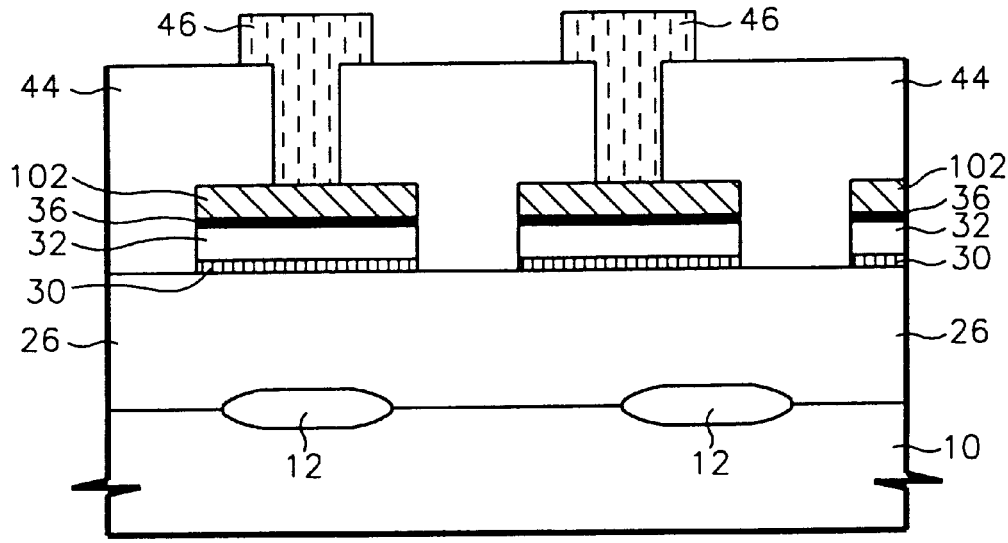

In FIGS. 4C and 5C, it is illustrated that a metal layer 46 is formed by the below described process steps.

With reference to FIGS. 4C and 5C, on the resulting substrate where the cell capacitor 100 and the resistor 102 are formed, an insulating layer such as, an oxide layer, BPSG (Boro-Phosphorous Silicate Glass) or the like is deposited to form an inter-layer insulating layer 44. The inter-layer insulating layer 44 on the resistor 102 is partially etched to form a contact window, and then a conductive layer such as aluminum is coated over the resulting substrate and then patterned to form a metal layer 46.

Now that the sheet resistance of the resistor 102 is varied depending on the impurity concentration of the polysilicon, the size of the resistor 102 may be changed based on the impurity concentration of the doped polysilicon.

Figure 2A:
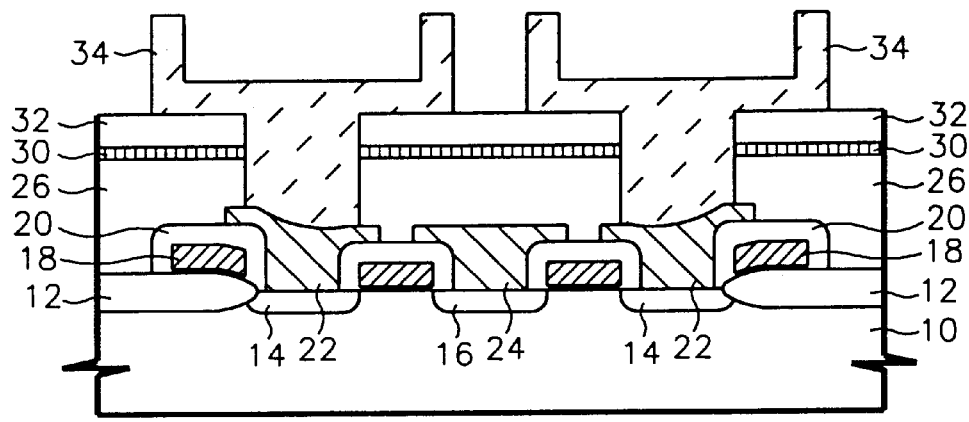
Figure 2B:
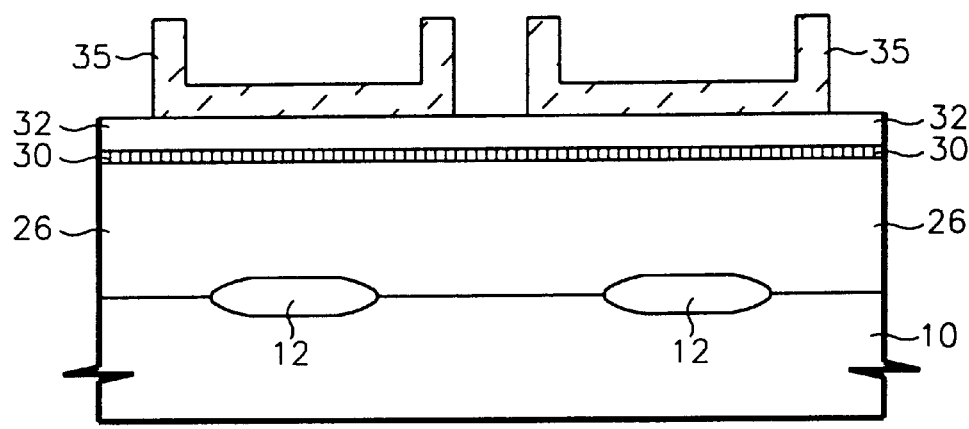

Further, since the surface of the resistor has a plane surface, a contact window may be easily formed. According to the conventional method in which the resistor (referring to numeral 35 of FIG. 2B) is formed in a three-dimensional structure, it has been nearly impossible to form a contact window on the resistor.

As described above, a method for fabricating a semiconductor memory device according to the present invention has several advantages as follows:

First, since an upper surface of the resistor 102 is in a plane shape by the inter-insulation layer 26 as compared with a dummy storage electrode of the conventional DRAM device (referring to FIG. 2B), unstable resistance derived from deviation of large sheet resistance may be solved.

Second, since the sheet resistance of the resistor may be changed depending on the impurity concentration of the plate electrode-forming material layer, the size of the resistor may be controlled. For example, if the impurity concentration thereof is small, the sheet resistance becomes small and thus, the size of the resistor is small.

Third, the upper surface of the resistor is nearly plane, a contact window on the resistor may be easily formed.

This invention is limited to the above examples and it is explicitly understood that a lot of amendments and modifications within the technical concepts of the present invention will be made available by those who have a common knowledge in the field to which the present invention pertains.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A dynamic random access memory (DRAM) device having a memory cell array region and a peripheral circuit region at spaced apart locations in a semiconductor substrate, comprising:

an interlayer insulating layer having a planarized upper surface, on the semiconductor substrate;

a lower DRAM capacitor electrode on a first portion of the planarized upper surface of said interlayer insulating layer extending opposite the memory cell array region;

a capacitor dielectric layer having a first region therein that extends on said lower DRAM capacitor electrode and a second region therein that extends on a second portion of the planarized upper surface of said interlayer insulating layer;

an upper DRAM capacitor electrode on the first region of said capacitor dielectric layer, opposite said lower DRAM capacitor electrode; and a resistor comprising the same material as said upper DRAM capacitor electrode and having a planar upper surface that extends opposite the second region of said capacitor dielectric layer.

2. The memory device of claim 1, further comprising an etch-stop layer that extends between the first region of said capacitor dielectric layer and the planarized upper surface of said interlayer insulating layer and also extends between the second region of said capacitor dielectric layer and the planarized upper surface of said interlayer insulating layer.

3. The memory device of claim 1, wherein said capacitor dielectric layer comprises a nitride-oxide composite layer; and wherein said upper DRAM capacitor electrode and said resistor both comprise polysilicon.

4. The memory device of claim 1, wherein said capacitor dielectric layer comprises tantalum oxide; and wherein said upper DRAM capacitor electrode and said resistor both comprise a composite of a polysilicon layer and a titanium nitride layer.

5. The memory device of claim 1, wherein said lower DRAM capacitor electrode comprises a U-shaped capacitor electrode.

6. The memory device of claim 1, wherein said resistor comprises a vertical stack of an etch-stop layer having a planar upper surface, said capacitor dielectric layer and a polysilicon layer.

7. The memory device of claim 6, further comprising:

an upper interlayer insulating layer having a resistor contact hole therein, on sidewalls and an upper surface of the vertical stack; and a resistor contact that extends in the resistor contact hole and contacts the polysilicon layer.

8. The memory device of claim 2, wherein said capacitor dielectric layer comprises a nitride-oxide composite; and wherein said upper DRAM capacitor electrode and said resistor both comprise polysilicon.

9. The memory device of claim 2, wherein said capacitor dielectric layer comprises tantalum oxide; and wherein said upper DRAM capacitor electrode and said resistor both comprise a composite of a polysilicon layer and a titanium nitride layer.

* * * * *